(12) United States Patent  
Bu et al.

(10) Patent No.: US 8,084,787 B2
(45) Date of Patent: Dec. 27, 2011

(54) PMD LINER NITRIDE FILMS AND FABRICATION METHODS FOR IMPROVED NMOS PERFORMANCE

(75) Inventors: Haowen Bu, Plano, TX (US); Rajesh Khamankar, Coppell, TX (US); Douglas T. Grider, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 745 days.

(21) Appl. No.: 11/740,426

(22) Filed: Apr. 26, 2007

(65) Prior Publication Data

US 2008/0251850 A1   Oct. 16, 2008

Related U.S. Application Data

(62) Division of application No. 10/827,692, filed on Apr. 19, 2004, now Pat. No. 7,226,834.

(51) Int. Cl.
*H01L 27/118* (2006.01)

(52) U.S. Cl. .................. 257/204; 257/288

(58) Field of Classification Search .......... 257/288, 257/204
See application file for complete search history.

(56) References Cited

U.S. PATENT DOCUMENTS

| | | | |
|---|---|---|---|
| 5,019,882 A | 5/1991 | Solomon et al. | |
| 5,241,197 A | 8/1993 | Murakami et al. | |
| 5,683,934 A | 11/1997 | Candelaria | |
| 5,863,827 A | 1/1999 | Joyner | |
| 5,882,981 A | 3/1999 | Rajgopal et al. | |
| 6,004,871 A | 12/1999 | Kittl et al. | |
| 6,087,241 A | 7/2000 | St. Amand et al. | |
| 6,211,064 B1 | 4/2001 | Lee | |
| 6,214,699 B1 | 4/2001 | Joyner | |
| 6,261,964 B1 | 7/2001 | Wu et al. | |
| 6,284,233 B1 | 9/2001 | Simon et al. | |
| 6,284,626 B1 | 9/2001 | Kim | |
| 6,284,633 B1 | 9/2001 | Nagabushnam et al. | |
| 6,406,973 B1 | 6/2002 | Lee | |
| 6,483,172 B1 * | 11/2002 | Cote et al. | 257/639 |
| 6,573,172 B1 | 6/2003 | En et al. | |
| 7,084,061 B2 * | 8/2006 | Sun et al. | 438/685 |
| 2003/0111699 A1 | 6/2003 | Wasshuber et al. | |
| 2004/0253791 A1 | 12/2004 | Sun et al. | |

\* cited by examiner

*Primary Examiner* — Douglas Menz
(74) *Attorney, Agent, or Firm* — Jacqueline J. Garner; Wade J. Brady, III; Frederick J. Telecky, Jr.

(57) ABSTRACT

Semiconductor devices (102) and fabrication methods (10) are provided, in which a nitride film (130) is formed over NMOS transistors to impart a tensile stress in all or a portion of the NMOS transistor to improve carrier mobility. The nitride layer (130) is initially deposited over the transistors at low temperature with high hydrogen content to provide a moderate tensile stress in the semiconductor body prior to back-end processing. Subsequent back-end thermal processing reduces the film hydrogen content and causes an increase in the applied tensile stress.

8 Claims, 4 Drawing Sheets

PMD LINER NITRIDE FILMS AND FABRICATION METHODS FOR IMPROVED NMOS PERFORMANCE

This is a divisional application of Ser. No. 10/827,692 filed Mar. 19, 2004.

FIELD OF INVENTION

The present invention relates generally to semiconductor devices with nitride films for improved NMOS transistor performance and fabrication methods for making the same.

BACKGROUND OF THE INVENTION

Semiconductor devices typically include MOS transistors for switching, amplification, and other functions. Current trends in the semiconductor industry include faster switching speeds, reduced power consumption, and lower operating voltages, wherein the performance of MOS transistors needs to he correspondingly improved. For example, high-speed transistors are required for modem wireless communications systems, portable computers, and other low-power, low-voltage devices, wherein MOS transistors must be adapted to operate at lower voltages using less power.

The carrier mobility in a MOS transistor has a significant impact on power consumption and switching performance. The carrier mobility is a measure of the average speed of a carrier (e.g., holes or electrons) in a given semiconductor, given by the average drift velocity of the carrier per unit electric field. Improving the carrier mobility can improve the switching speed of a MOS transistor, and can also facilitate operation at lower voltages, alone or in combination with reducing the transistor channel length and gate dielectric thickness to improve current drive and switching performance.

Carrier mobility of a MOS transistor is affected by the mechanical stress in the device channel. The carrier mobility can be improved by depositing silicon/germanium alloy or other material layers between upper and lower silicon layers under compressive stress, in order to enhance hole carrier mobility in a channel region. For NMOS transistors, tensile stress in the channel material improves carrier mobility by lifting conduction band degeneracy. However, buried silicon/germanium channel layer devices have shortcomings, including increased alloy scattering in the channel region that degrades electron mobility, a lack of favorable conduction band offset which mitigates the enhancement of electron mobility, and the need for large germanium concentrations to produce strain and thus enhanced mobility. Furthermore, such additional alloy layers and silicon layers are costly, adding further processing steps to the device manufacturing procedure.

Thus, there is a need for methods and apparatus by which the carrier mobility and other electrical operational properties of NMOS transistor devices may be improved so as to facilitate improved switching speed and low-power, low-voltage operation, without significantly adding to the cost or complexity of the manufacturing process.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention relates to semiconductor devices and fabrication methods therefor, in which a liner nitride layer is formed over NMOS transistors to provide a tensile stress in the transistor to enhance the carrier mobility, thereby facilitating high-speed, low power, low voltage device operation. The nitride layer can be any silicon nitride material formed over NMOS transistors, which may also function as a protective liner and as an etch-stop material during formation of openings for contacts to transistor terminals through an overlying dielectric (e.g., pre-metal dielectric or PMD), and may also be formed over PMOS transistors.

One aspect of the invention provides a method of improving NMOS transistor performance. The method comprises depositing a nitride layer over an NMOS transistor that has an initial or as-deposited hydrogen content of about 20 atomic percent or more, and that provides a moderate initial tensile stress in at least a portion of the NMOS transistor of about 400 MPa or more and about 600 MPa or less. The method further comprises performing at least one thermal process after depositing the nitride layer, which may include normal back-end processing, such as metalization, sintering, or other operations in which heat is provided to a semiconductor device wafer, wherein the nitride layer comprises a hydrogen content of about 20 atomic percent or less following the thermal processing, and wherein the NMOS tensile stress is about 1 GPa or more after the thermal processing.

Another aspect of the invention provides methods for fabricating a semiconductor device, in which an NMOS transistor is formed, having an NMOS channel region in a semiconductor body. A nitride layer is deposited over the NMOS transistor, such as after silicide contact formation, where the nitride layer has a relatively high initial (e.g., as-deposited) hydrogen content of about 20 atomic percent or more. The deposited nitride layer provides a modest tensile stress in the NMOS transistor, such as about 400-600 MPa following deposition. Thermal processing, such as back-end metalization, sintering, etc., may then be performed, resulting in reduction in the nitride layer hydrogen content and increased tensile stress.

In one implementation, the final (e.g., post-back-end) stress provided to at least a portion of the NMOS region of the semiconductor body is 1 GPa or more and the nitride layer hydrogen content is reduced to about 15-20 atomic percent. The inventors have appreciated that the initial provision of a meta-stable nitride with high hydrogen content over the NMOS transistors facilitates improved NMOS performance following the thermal processing associated with back-end processing, wherein the thermal processing causes a slight reduction in the nitride hydrogen content and increases the stress effect on the NMOS channel. The end effect is to improve the carrier mobility in the NMOS devices, wherein the same nitride film may be concurrently formed over PMOS transistors in a device without severe degradation. The initial nitride layer may be formed using any suitable process, such as plasma enhanced chemical vapor deposition (PECVD) performed at relatively low deposition temperatures (e.g., about 350 degrees C. or less in one implementation).

Another aspect of the invention provides semiconductor device fabrication methods comprising forming at least one NMOS transistor, depositing a nitride layer over the NMOS transistor, the nitride layer providing an initial tensile stress in at least a portion of the NMOS region of about 400 MPa or more and about 600 MPa or less, and performing thermal processing on the semiconductor device after depositing the nitride layer, wherein the nitride layer provides a tensile stress in at least a portion of the NMOS region of the semiconductor body of about 1 GPa or more following the thermal processing.

Yet another aspect of the invention provides a semiconductor device comprising an NMOS transistor with a channel having a tensile stress of about 200 MPa or more, and a nitride layer over the NMOS transistor that has a hydrogen content of about 15 atomic percent or more. The nitride layer in one implementation has a hydrogen content of about 15-20 atomic percent, and may also be formed over PMOS transistors in the device. Still another aspect of the invention provides semiconductor devices comprising NMOS and PMOS transistors with a nitride layer thereover, where at least a portion of the NMOS transistor region of the semiconductor body has a tensile stress of about 1 GPa or more. Yet another aspect of the invention provides a semiconductor device comprising NMOS and PMOS transistors with an overlying nitride layer that comprises a hydrogen content of about 15 atomic percent or more.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
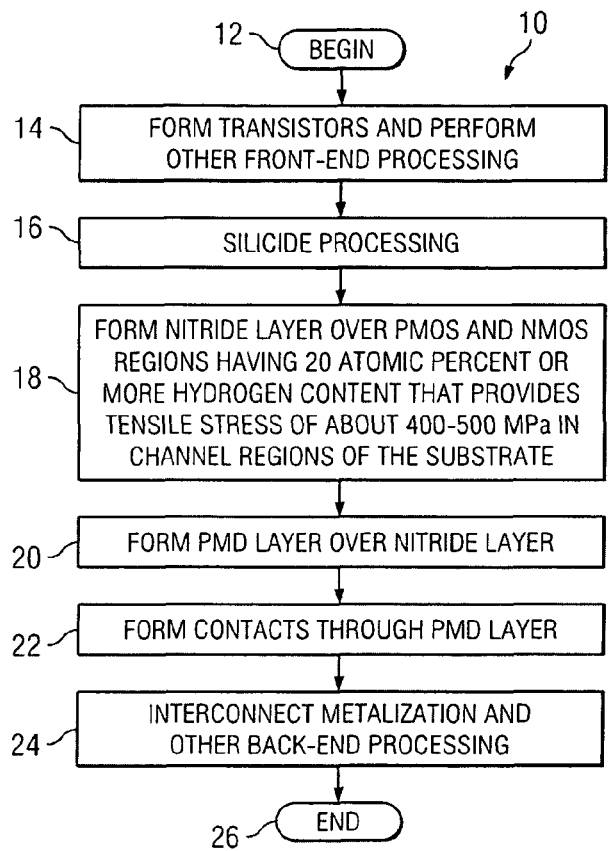
FIG. 1 is a flow diagram illustrating an exemplary method of fabricating semiconductor devices in accordance with one or more aspects of the invention.

One or more implementations of the present invention will now he described with reference to the attached drawings, wherein like reference numerals are used to refer to like elements throughout, and wherein the illustrated structures are not necessarily drawn to scale. The invention provides techniques for improving the performance of NMOS transistors in semiconductor devices, in which tensile stress is provided to the NMOS channels. The various aspects of the invention may advantageously be employed in order to improve NMOS carrier mobility, thereby facilitating improved switching speed and low-power, low-voltage NMOS operation, without significantly adding to the cost or complexity of the manufacturing process.

Referring initially to FIG. 1, the invention provides semiconductor device fabrications methods and methods for improving NMOS transistor performance using tensile stress in the transistor channel through formation of a silicon nitride film or layer (e.g., referred to hereinafter as a nitride layer) over the transistors prior to back-end processing. FIG. 1 illustrates an exemplary method 10 for fabricating semiconductor devices in accordance with one or more aspects of the invention. Although the method 10 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not ail illustrated steps may be required to implement a methodology in accordance with the present invention. Furthermore, the methods according to the present invention may be implemented in association with the devices and systems illustrated and described herein as well as in association with other structures not illustrated.

Beginning at 12, the method 10 comprises forming transistors at 14, including fabrication of NMOS and PMOS transistors in/on NMOS and PMOS regions of a semiconductor body, as well as performing other front-end processing. Any front-end processing may be performed at 14 within the scope of the invention, for example, formation of n and p wells using diffusion, implantation, or other suitable processing steps, as well as formation of isolation structures in field regions of a device wafer, using LOCOS, STI or any suitable isolation processing prior to transistor formation. Prospective channel regions of the semiconductor body may be initially doped at 14 to adjust the prospective transistor work functions, to suppress punch-through, etc. A gate dielectric is then formed above the semiconductor body and conductive gate structures are formed above the gate dielectric over the prospective channel regions, such as through deposition and patterning of doped polysilicon or other conductive material. Source/drain regions of the semiconductor body are then doped using suitable dopant species for NMOS and PMOS transistors, such as through selective implantation. Silicide processing is then performed at 16 to create conductive contacts at the transistor terminals (e.g., source/drains and gates), using any suitable materials (e.g., nickel silicide, cobalt silicide, etc.).

In accordance with the present invention, a nitride layer is then formed at 18 over the NMOS and PMOS transistors. The nitride material layer formed at 18 comprises silicon and nitrogen of any suitable stoichiometry. such as $Si_3N_4$ or stoichiometric variations thereof (e.g., silicon nitride). In one aspect of the Invention, the nitride comprises a relatively high initial (e.g., as-deposited) hydrogen content of about 20 atomic percent or more. In another aspect of the invention, the nitride layer formed at 18 initially provides a tensile stress of about 400-600 MPa in at least a portion of the NMOS region of the substrate prior to subsequent back-end thermal processing.

In one implementation, the nitride is deposited at 18 via a plasma enhanced chemical vapor deposition (PECVD) process using a relatively low deposition temperature of about 350 degrees C. or less to provide a meta-stable nitride film covering the NMOS and PMOS transistors with relatively high hydrogen content, in this example, the PECVD chamber pressure is controlled to about 3.5 Torr or more, with a silane ($SiH_4$) gas flow of about 150 sccm or less, and ammonia ($NH_3$) gas flow of about 2500-3000 sccm, using high frequency RF power set at about 50 W at 13.56 MHz and low frequency power set at about 10-20 W 20 W at 350 KHz. This exemplary PECVD process provides a meta-stable silicon nitride film (e.g., $Si_xN_y$, where X is approximately 3 and Y is approximately 4 in one example) with high hydrogen content, with the hydrogen being bonded about equally with silicon (e.g., Si—H bonds) and with nitrogen (e.g., N—H bonds). Moreover, this as-deposited meta-stable nitride film imparts a moderate initial tensile stress in the NMOS regions of the semiconductor body (e.g., about 400-600 MPa in this example). The above is merely one example of a suitable deposition process that may be employed to form the nitride layers of the present invention, wherein any suitable processing conditions and techniques may be employed, and all such variant implementations are contemplated as falling within the scope of the present invention and the appended claims.

After formation of the nitride layer, back-end processing is performed at 20-24, which involves heating the device wafer. The inventors have appreciated that this thermal processing following formation of the nitride layer at 18 causes stabilization of the nitride film that involves moderate reduction in the hydrogen content thereof, as well as an increase in the tensile stress in the NMOS semiconductor body regions. This increased NMOS tensile stress, in turn, enhances NMOS carrier mobility and improves the NMOS transistor performance, wherein portions of the NMOS channel regions of the semiconductor body will attain a tensile stress of about 200 MPa or more following the thermal processing, in addition to NMOS performance enhancement, the nitride film deposited at 18 may also operate as a PMD liner to protect the underlying transistors from a subsequently formed pre-metal dielectric (PMD) material, and as an etch-stop layer in forming openings for contacts to transistor terminals through the PMD material. The inventors have further found that the same nitride film can be formed over PMOS transistors with little adverse effects on the PMOS device performance, whereby the formation of the nitride layer at 18 does not add cost or complexity to the fabrication of semiconductor devices.

At 20, an initial dielectric material (e.g., PMD) is formed over the nitride layer, wherein the deposition processing used in forming the PMD material heats the nitride layer. At 22, conductive contacts are formed through the PMD layer and through portions of the nitride layer to provide electrical connection for the transistor terminals (e.g., connecting to the silicided transistor gates and source/drains). The contact formation at 22 comprises forming openings in the PMD material through suitable masking and etching processes, followed by deposition of conductive material (e.g., tungsten or other suitable materials), and subsequent planarization (e.g., chemical mechanical polishing, etc.). As with the PMD deposition, the contact formation at 22 further heats the nitride film overlying the NMOS (e.g., and PMOS) transistors. One or more metalization levels or layers are then formed at 24 to provide electrical interconnection of the various electrical components in the device, wherein each metalization level includes an inter-level or inter-layer dielectric (ILD) formed over a preceding level, with vias and/or trenches formed therein and filled with conductive material (e.g., copper, etc). Other typical back-end processing may be performed at 24 before the exemplary method 10 ends at 26, including hydrogen sintering and other processes that further heat the nitride PMD liner.

Figure 2:
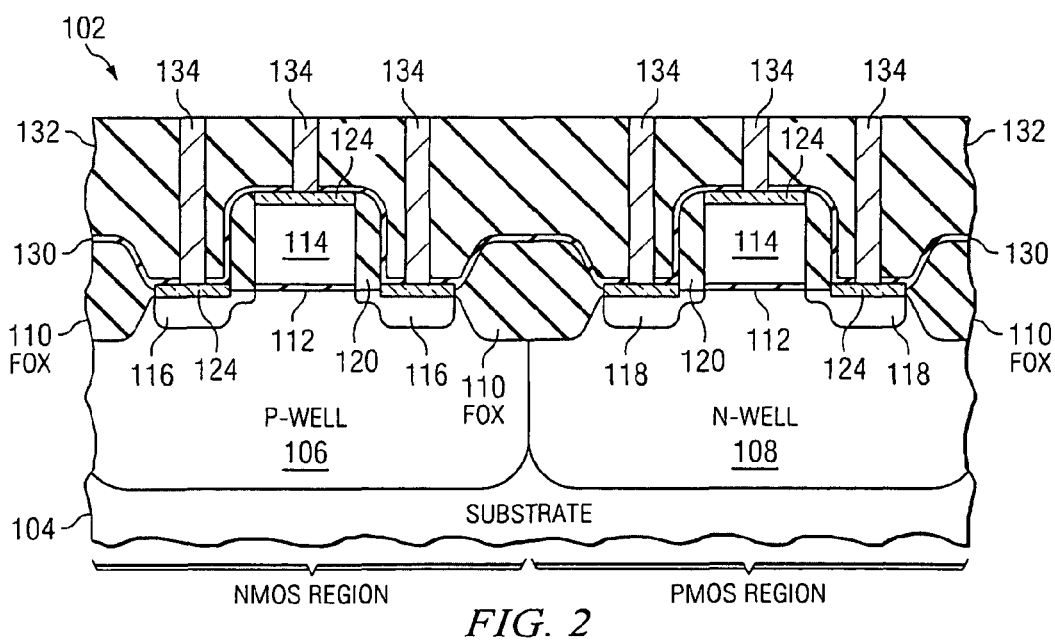
FIG. 2 is a partial side elevation view in section illustrating an exemplary semiconductor device with a nitride layer formed over NMOS and PMOS transistors in accordance with the invention.

Referring also to FIG. 2, in accordance with another aspect of the invention, the provision of heat to the nitride film over the NMOS transistors through the back-end or other thermal processing causes a transformation thereof to a more stable final state following the thermal processing, in the exemplary implementations illustrated and described herein, the back-end thermal processing causes a release of some of the as-deposited hydrogen content of the nitride film, wherein the final nitride layer comprises a hydrogen content of about 20 atomic percent or less following the thermal processing, about 15 atomic percent or more in one example. While not wishing to be tied to any particular theory, it is believed that the hydrogen is primarily released from the initial N-H bonds during the post-deposition thermal processing. In addition to the benefit from the increased tensile stress, the PMD liner nitride layer is also believed to effectively serve as a hydrogen source for the NMOS (e.g., and PMOS) transistors it covers, in this regard, the release of a portion of the initially high hydrogen content (e.g., about 3-7% hydrogen is released after the film deposition due to subsequent thermal processing in one example), and migration thereof into the underlying transistors is believed to passivate interface states and modify the dopant diffusion in the transistors, resulting in an improved device.

Further, the thermal processing results in significantly increased tensile stress in at least a portion of the NMOS region of the semiconductor body, to a final tensile stress about 1 GPa or more in at least a portion of the NMOS region of the semiconductor body following the thermal processing, wherein the final NMOS stress in portions of the NMOS channel are 200 MPa or more. The Invention provides nitride films that initially impart modest tensile stresses (e.g., 400 MPa or more and about 600 MPa or less as-deposited), and increased final stresses of 1 GPa or more following post-nitride deposition thermal processing for improved NMOS performance, in this regard, high as-deposited film hydrogen content and/or low deposition temperatures are believed to aid in formation of an initially meta-stable nitride film, wherein low deposition temperatures are believed to facilitate the initially high hydrogen content of the as-deposited film.

With respect to deposition temperature, it is noted that simply increasing deposition temperature is believed to provide nitride films that impart higher as-deposited tensile NMOS stress. However, the invention instead provides meta-stable nitride films that induce moderate as-deposited tensile stress levels (e.g., 400-600 MPa in the illustrated examples). The film then undergoes property changes during the subsequent thermal processing, wherein the modified film imparts an even higher tensile stress in the substrate after thermal processing. In this regard, it is believed that simply depositing a nitride film at higher temperatures to provide high initial (e.g., as-deposited) NMOS semiconductor body stress does not provide the same amount of post-thermal processing stress which can be achieved using the techniques of the present invention, wherein the relative instability of the as-deposited films of the invention facilitate the change in stress.

FIG. 2 illustrates an exemplary CMOS device 102 with NMOS and PMOS transistors and a nitride PMD liner layer or film in accordance with the present invention, following back-end processing, wherein a multi-level interconnect routing structure and the corresponding ILD material layers are omitted from FIG. 2. The device 102 comprises a silicon substrate semiconductor body 104 with a p-well 106 formed in an NMOS region and an n-well 108 formed in a PMOS region, as well as field oxide (FOX) isolation structures 110. A gate dielectric 112 is formed over the surface of the substrate 104 in NMOS and PMOS active regions of the device 102 between the FOX isolation structures 110, for example, a thermally grown $SiO_2$ oxide 112 or any other suitable dielectric material, Polysilicon gate electrodes 114 are formed by deposition and patterning over the gate dielectric 112 above NMOS and PMOS channel regions of the substrate 104, Source/drains 116 and 118 are implanted with N and P-type dopants for the NMOS and PMOS transistors, respectively, wherein the NMOS channel region is the portion of the substrate 104 laterally between the NMOS source/drains 116 and beneath the gate oxide 112. Sidewall spacers 120 are formed along the gate structure sidewalls and silicide contacts 124 are formed at the upper surfaces of the source drains 116, 118, and the gates 114, In accordance with the invention, the device 102 comprises a nitride layer 130 formed over the transistors (e.g., and over the silicide 124), where the nitride layer 130 comprises a hydrogen content of about 15 atomic percent or more and about 20 atomic percent or less. In addition, at least a portion of the NMOS region in the semiconductor body 104 has a tensile stress of about 1 GPa or more, such as about 1.0 to 1.3 GPa in one example, wherein the NMOS channel region thereof is about 200 MPa or more. The device 102 also comprises an initial dielectric (e.g., PMD) material 132 above the nitride 130, with conductive (e.g., tungsten) contacts 134 formed therein to connect with the silicide 124 of the gates 114 and the source/drains 116, 118. The exemplary nitride layer 130 in the device 102 comprises silicon nitride (e.g., $Si_3N_4$ or stoichiometric variations thereof), including a hydrogen content of about 15 to 20 atomic percent, which is believed to comprise more silicon-bonded hydrogen than nitrogen bonded hydrogen. The nitride layers and semiconductor devices of the invention (e.g., layer 130 in the device 102) can be formed by any suitable methods or techniques within the scope of the invention.

Figure 3A:
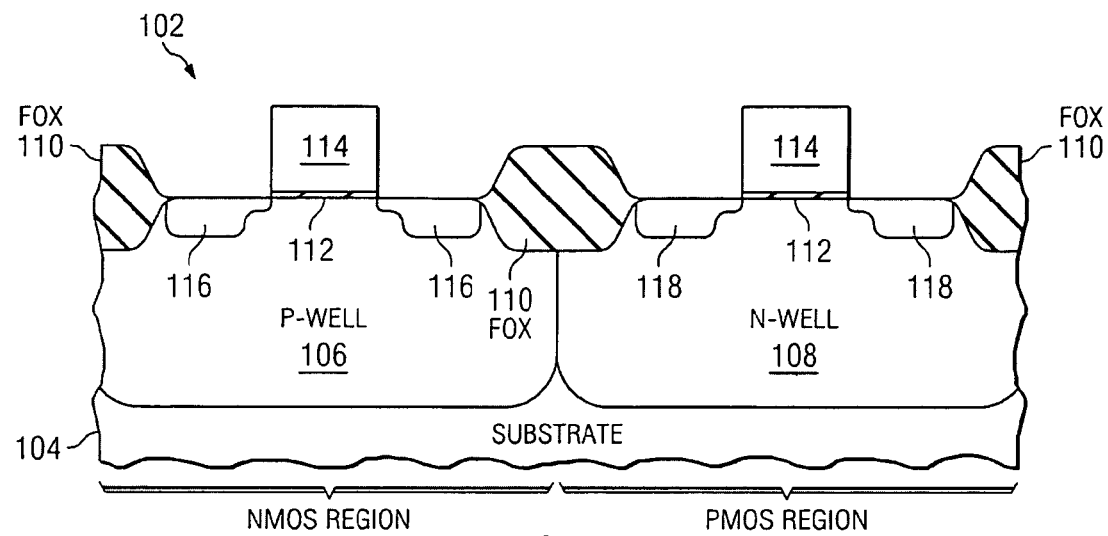
FIGS. 3A-3F are partial side elevation views in section illustrating the exemplary semiconductor device of FIG. 2 at various stages of fabrication processing in accordance with the invention.

FIGS. 3A-3F illustrate the exemplary semiconductor device 102 undergoing fabrication processing generally according to the method 10 described above, in FIG. 3A, the device is shown following front-end processing including formation of NMOS and PMOS transistors (e.g., at 14 in the method 10 of FIG. 1), with channel regions of the semiconductor body 104 extending laterally between the respective source/drains 116, 118 and under the gate structures 112, 114. The invention may be employed in association with any type of semiconductor body 104, including but not limited to silicon substrates, SOI wafers, etc. In addition, the invention may be employed with any NMOS (e.g., and PMOS) transistors, in the exemplary NMOS transistor, shallow trench isolation (STI) is used. The gate is a bilayer structure including $SiO_2$ gate oxide material 112 and doped polysilicon gate contact material 114. However, any suitable gate dielectric 112 (e.g., high-k dielectrics or otherwise) and conductive gate contact material 114 may be used (e.g., including metals, and multi-layer structures) within the scope of the invention. The source/drains 116, 118 can be of any suitable dopant species, type, concentrations, and dimensions within the scope of the invention, such as n-doped NMOS source drains 116 (e.g., doped with phosphorus, antimony, arsenic, etc.) and p-doped PMOS source/drains 118 (e.g., doped with boron, gallium, etc.).

Figure 3B:
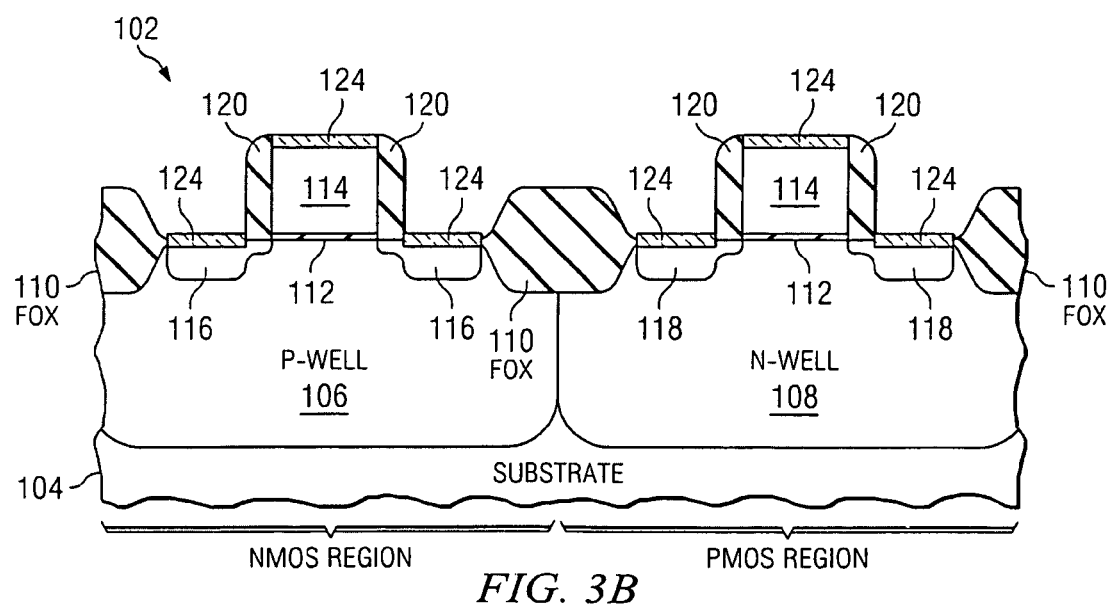
Figure 3C:
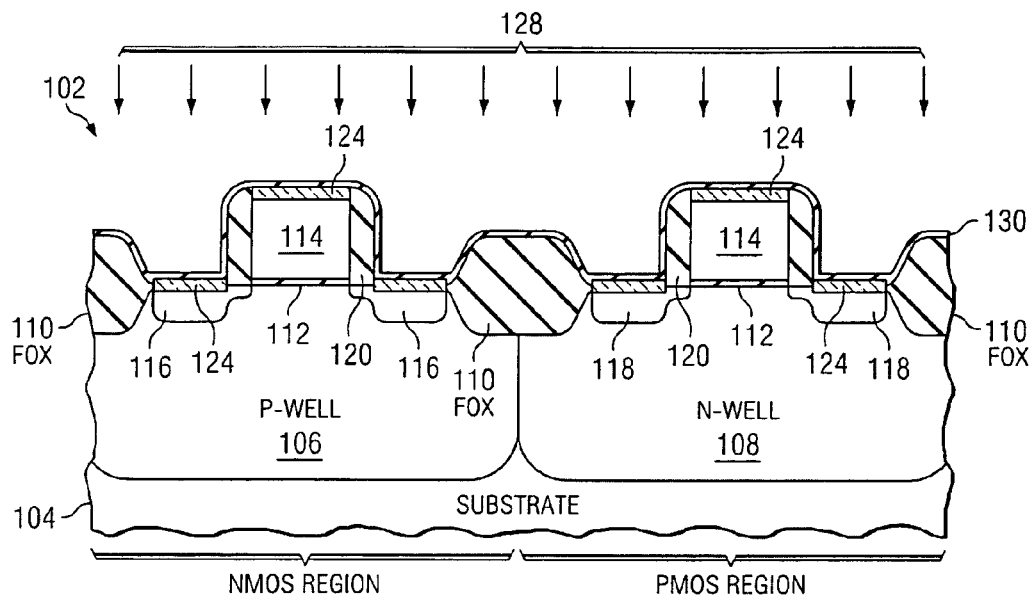

Sidewall spacers 120 are formed in FIG. 3B along sidewalls of the gates 114. The sidewall spacers 120 may be any suitable material, including but not limited to silicon nitride, silicon oxide, or stacks or combinations thereof. Also in FIG. 3B, silicide processing is performed (e.g., 16 in FIG. 1) to create conductive silicide contacts 124 at the transistor gate and source/drain terminals. Any suitable silicide materials 124 may be employed, such as nickel or cobalt silicide.

In one example, a layer of nickel is deposited over the device 102 after formation of the sidewall spacers 120 that overlies the gate polysilicon 114 of the patterned gate stacks and also the doped source/drains 116 and 118 of the substrate 104. A thermal anneal is performed to react the nickel with the gate polysilicon 114 and with the source/drain substrate material 116, 118, thereby forming a metal silicide 124 above the transistor terminals 114, 116, and 118 as illustrated in FIG. 3B.

In FIG., 3C, a PECVD process 128 is performed to deposit a silicon nitride layer 130 over the transistors, where the layer 130 has an as-deposited hydrogen content of about 20 atomic percent or more, and where the nitride 130 provides an initial tensile stress of about 400-600 MPa in at least a portion of the NMOS region of the semiconductor body 104. Any suitable nitride deposition process 128 may be used, wherein the exemplary PECVD process 128 is performed at about 350 degrees C. or less, with a deposition chamber pressure of about 3.5 Torr or more, a silane ($SiH_4$) gas flow of about 150 sccm or less, and an ammonia ($NH_3$) gas flow of about 2500-3000 sccm, using high frequency RF power of about 50 W at 13.56 MHz, and low frequency power of about 10-20 W at 350 KHz. As discussed above, the exemplary film 130 is meta-stable with a relatively high hydrogen content and operates to impart a moderate tensile stress in all or a portion of the NMOS region of the substrate 104 after the deposition process 128, such that subsequent application of thermal energy during back-end processing causes a reduction in the hydrogen content and an increase in the applied tensile stress in the NMOS region (e.g., to about 1 GPa or more in at least a portion of the NMOS region).

The nitride layer 130 may be formed to any suitable thickness within the scope of the invention, such as about 300 Å or more, about 500 Å in one example, Furthermore, the inventors have found that with respect to drain current performance, thicker nitride layers 130 perform better than thin layers 130. Since the nitride layer 130 can also be used as an etch stop layer in the creation of contact openings in a subsequently formed PMD dielectric material, wherein the thickness of the layer 130 may be selected according to the etch stop performance as well as according to the desired drain current performance, and the distance between the sidewall spacer structures 120 of the closet two neighboring transistors (not shown), wherein the PMD contact etch and etch-stop etch processes may be adjusted to accommodate thicker nitride layers 130, in the exemplary implementations illustrated and described herein, for example, NMOS drain current is improved by 2-10% after back-end processing, depending on the thickness of the nitride film 130, with minimal changes in the fabrication process flow and minimal performance degradation of PMOS transistors. Moreover, the invention provides a higher final NMOS region tensile stress and better NMOS transistor performance compared with initially depositing a more stable film that creates high initial stress.

Figure 3D:
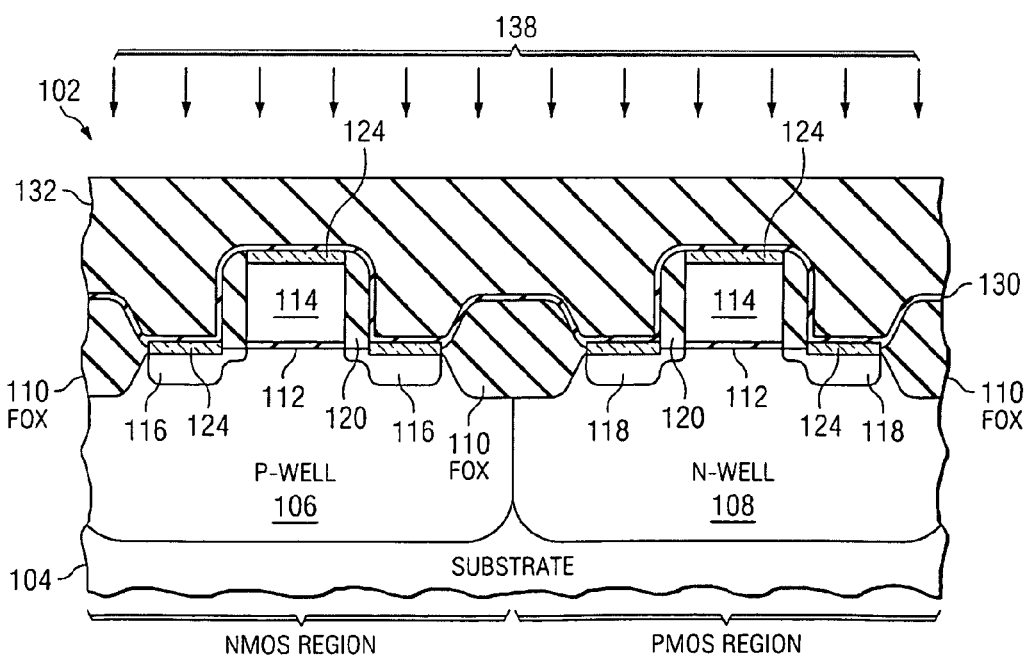

In FIG. 3D, an initial dielectric (PMD) layer 132 is deposited over the nitride layer 130 via a deposition process 138. In one implementation, the PMD layer 132 comprises a phosphorous doped silicon oxide, deposited to a thickness of about 9000 Å over the nitride 130, which provides insulation between overlying 20 and underlying conductive features, such as between the silicide contacts 124 and later-formed conductive interconnect features in subsequent metallization layers of the device 102. The deposition process 138 and subsequent back-end processing steps provide thermal processing of the nitride layer 130, causing the as-deposited meta-stable nitride material layer 130 to further stabilize and thereby to increase the tensile stress provided in the NMOS regions of the semiconductor body 104.

Figure 3E:
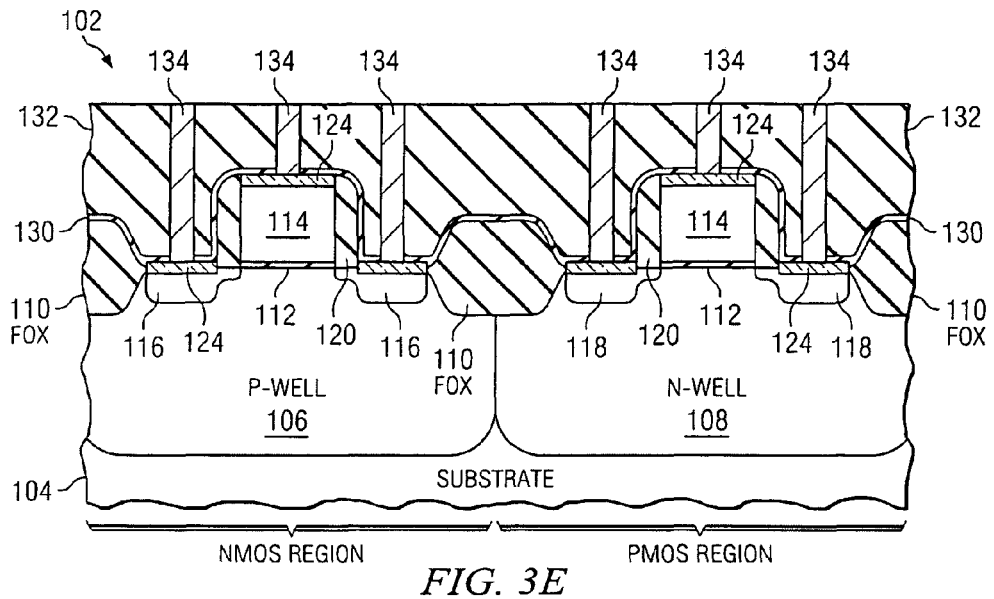

FIG. 3E illustrates the device 102 following formation of conductive contacts 134 to connect with the silicide 124. The contact formation involves further thermal processing, including etching contact openings through the 30 dielectric 132, and etch-stop etching to remove portions of the nitride layer 130 at the bottom of the etched contact openings. The openings are then filled with conductive material 134, such as tungsten or the like, and the device 102 is then planarized through chemical mechanical polishing (CMP) or other suitable techniques, leaving the structure as illustrated in FIG. 3E. A multilayer or multi-level interconnect routing (e.g., metalization) structure is then formed above the PMD layer 132, a portion of which is illustrated in FIG. 3F, including a first inter-level dielectric (ILD) layer 142 with dual damascene type via/trench openings filled with conductive (e.g., copper) features 144, as well as a similarly-constructed second ILD material 152 with conductive features 154 therein, wherein further interconnect layers or levels may be provided above the ILD 152 (not shown).

Figure 3F:
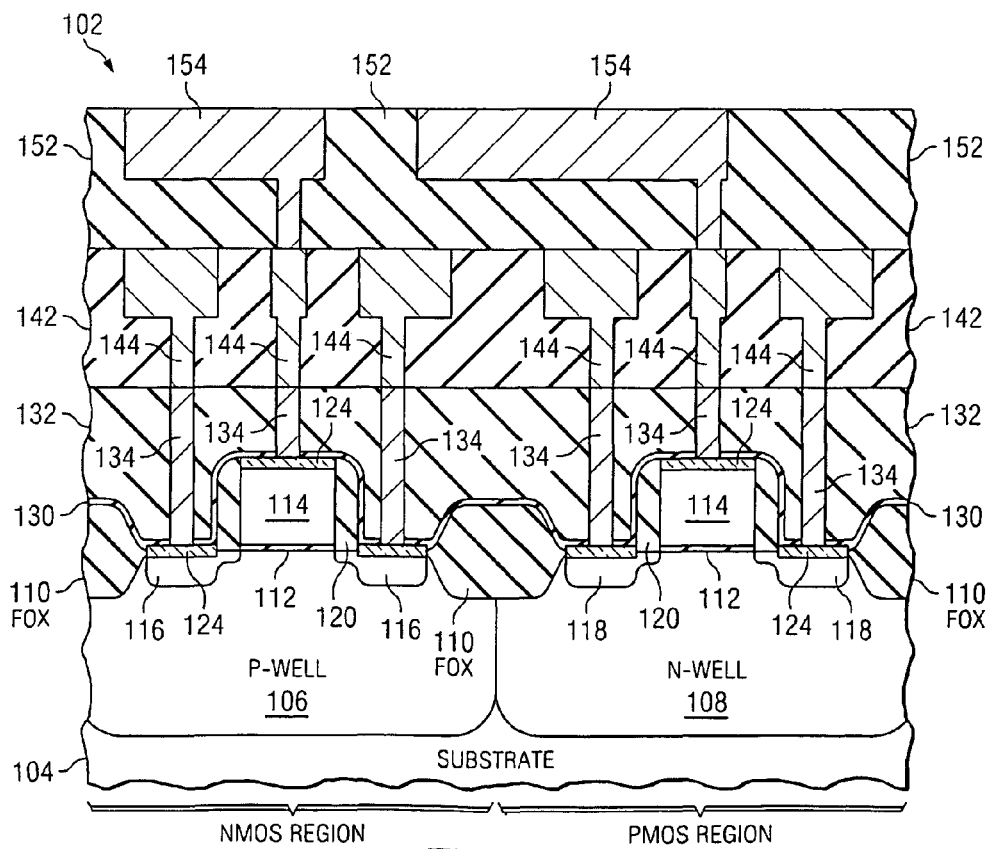

The thermal processing associated with the PMD, ILD, and other back-end processing causes a transformation of the nitride layer 130 to a final state along with a release of some of the as-deposited hydrogen content, where the final nitride layer 130 in FIG. 3F has a lower hydrogen content (e.g., about 15-20 atomic percent in this example). Moreover, the stabilization of the nitride 130 significantly Increases the applied tensile stress in at least a portion of the NMOS region of the semiconductor body 104, to a final tensile stress about 1 GPa or more. The Invention thus provides nitride films 130 that initially impart modest tensile stresses (e.g., 400-600 MPa as-deposited), and increased final stresses of 1 GPa or more following post-nitride deposition thermal processing for improved NMOS performance.

Although the invention has been illustrated and described with respect to one or more implementations, alterations and/or modifications may be made to the illustrated examples without departing from the spirit and scope of the appended claims, In particular regard to the various functions performed by the above described components or structures (assemblies, devices, circuits, systems, etc), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "Including", "includes", "having", "has", "with", or variants thereof are used in either the detailed description and the claims, such terms are intended to be inclusive in a manner similar to the term "comprising".

What is claimed is:

1. A semiconductor device, comprising:
    an NMOS transistor comprising an NMOS channel region of a semiconductor body;
    a PMOS transistor comprising a PMOS channel region of the semiconductor body; and
    a nitride layer over the NMOS and PMOS transistors, wherein the nitride layer imparts a tensile stress in the NMOS transistor with little adverse effect on the PMOS transistor, wherein the nitride layer has an initial hydrogen content of 20 percent or more and a subsequent hydrogen content in the range of 15 to 20 percent after thermal treatment and wherein the initial hydrogen content is associated with a first tensile stress in at least a portion of the NMOS region and said subsequent hydrogen content is associated with a second tensile stress in the portion of the NMOS region, the second tensile stress being 1 GPa or more and greater than the first tensile stress.

2. The semiconductor device of claim 1, wherein the initial hydrogen content is present as deposited using a deposition temperature of 350 degrees or less.

3. The semiconductor device of claim 1, wherein the second tensile stress is at least 66 percent greater than the first tensile stress.

4. The semiconductor device of claim 1, further comprising:
    a gate silicide; and
    a source drain silicide, wherein the nitride layer is located over and in contact with the gate silicide and source drain silicide.

5. A semiconductor device, comprising:
    an NMOS transistor comprising an NMOS channel region of a semiconductor body;
    a PMOS transistor comprising a PMOS channel region of the semiconductor body; and
    a nitride layer over the NMOS transistor, wherein the nitride layer imparts a tensile stress in the NMOS, wherein the nitride layer has an initial hydrogen content of 20 percent or more and a subsequent hydrogen content in the range of 15 to 20 percent after thermal treatment and wherein the initial hydrogen content is associated with a first tensile stress in at least a portion of the NMOS region and said subsequent hydrogen content is associated with a second tensile stress in the portion of the NMOS region, the second tensile stress being 1 GPa or more and greater than the first tensile stress.

6. The semiconductor device of claim 5, wherein the initial hydrogen content is present as deposited using a deposition temperature of 350 degrees or less.

7. The semiconductor device of claim 5, wherein the second tensile stress is at least 66 percent greater than the first tensile stress.

8. The semiconductor device of claim 5, further comprising:
    a gate silicide; and
    a source drain silicide, wherein the nitride layer is located over and in contact with the gate silicide and source drain silicide.

* * * * *